(12) United States Patent
Graham et al.

(10) Patent No.: US 8,753,912 B2
(45) Date of Patent: Jun. 17, 2014

(54) NANO/MICROWIRE SOLAR CELL FABRICATED BY NANO/MICROSPHERE LITHOGRAPHY

(75) Inventors: William Graham, Irvington, NY (US); Supratik Guha, Chappaqua, NY (US); Oki Gunawan, Fair Lawn, NJ (US); George S. Tulevski, White Plains, NY (US); Kejia Wang, Poughkeepsie, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/445,101

(22) Filed: Apr. 12, 2012

(65) Prior Publication Data

US 2012/0196401 A1    Aug. 2, 2012

Related U.S. Application Data

(63) Continuation of application No. 12/480,163, filed on Jun. 8, 2009, now Pat. No. 8,211,735.

(51) Int. Cl.
*H01L 31/0352*    (2006.01)
(52) U.S. Cl.
USPC ............. 438/57; 977/888; 136/256; 438/700
(58) Field of Classification Search
CPC .................................................. H01L 31/1884
USPC ............. 438/73, 94; 257/E21.158; 977/813, 977/827; 136/255, 256
See application file for complete search history.

(56) References Cited

U.S. PATENT DOCUMENTS

| 4,099,986 A | 7/1978 | Diepers |
| 5,322,805 A * | 6/1994 | Allman et al. ................ 438/369 |

(Continued)

FOREIGN PATENT DOCUMENTS

| JP | 2002341161 A | 11/2002 |
| JP | 2007188962 A | 7/2007 |

(Continued)

OTHER PUBLICATIONS

B.M. Kayes et al., "Comparison of the Device Physics Principles of Planar and Radial p-n Junction Nanorod Solar Cells," J. Appl. Phys., vol. 97, 114302 (2005).

(Continued)

*Primary Examiner* — Olik Chaudhuri
*Assistant Examiner* — Christine Enad
(74) *Attorney, Agent, or Firm* — Vazken Alexanian; Michael J. Chang, LLC

(57) ABSTRACT

Techniques for fabricating nanowire/microwire-based solar cells are provided. In one, a method for fabricating a solar cell is provided. The method includes the following steps. A doped substrate is provided. A monolayer of spheres is deposited onto the substrate. The spheres include nanospheres, microspheres or a combination thereof. The spheres are trimmed to introduce space between individual spheres in the monolayer. The trimmed spheres are used as a mask to pattern wires in the substrate. The wires include nanowires, microwires or a combination thereof. A doped emitter layer is formed on the patterned wires. A top contact electrode is deposited over the emitter layer. A bottom contact electrode is deposited on a side of the substrate opposite the wires.

23 Claims, 8 Drawing Sheets

(56) References Cited

U.S. PATENT DOCUMENTS

| | | |
|---|---|---|
| 7,265,037 B2 | 9/2007 | Yang et al. |
| 7,335,395 B2 * | 2/2008 | Ward et al. .................... 427/198 |
| 7,432,522 B2 | 10/2008 | Samuelson et al. |
| 2005/0009224 A1 | 1/2005 | Yang et al. |
| 2006/0207647 A1 * | 9/2006 | Tsakalakos et al. .......... 136/256 |
| 2008/0047604 A1 * | 2/2008 | Korevaar et al. .............. 136/258 |
| 2008/0135089 A1 * | 6/2008 | Tsakalakos et al. .......... 136/248 |
| 2008/0149914 A1 * | 6/2008 | Samuelson et al. ................ 257/9 |
| 2010/0193768 A1 | 8/2010 | Habib |
| 2010/0221882 A1 * | 9/2010 | Samuelson et al. .......... 438/268 |

FOREIGN PATENT DOCUMENTS

| | | |
|---|---|---|
| WO | WO2007081510 A2 | 7/2007 |
| WO | WO2008045301 A1 | 4/2008 |
| WO | WO2008156421 A2 | 12/2008 |

OTHER PUBLICATIONS

USGS, Silicon: USGS Mineral Commodity Summaries, Jan. 2008.

C.L. Cheung et al., "Fabrication of Nanopillars by Nanosphere Lithography," Nanotech. 17, 1339 (2006).

Cheung et al., "Fabrication of nanopillars by nanospheres lithography," Published Research—Department of Chemistry, University of Nebraska—Lincoln (Feb. 2006).

Z. Huang et al., "Fabrication of Silicon Nanowire Arrays with Controlled Diameter, Length, and Density," Advanced Materials 19, 744 (2007).

L. Tsakalakos et al., "Strong Broadband Optical Absorption in Silicon Nanowire Films," J. Nanophot. 1, 013552 (2007).

L. Hu et al., "Analysis of Optical Absorption in Silicon Nanowire Arrays for Photovoltaic Applications," Nano Lett., vol. 7, No. 11, 3249 (2007).

* cited by examiner

100

1200

1300A

1300B

1300C

1400

1500

FIG. 16A
1600A
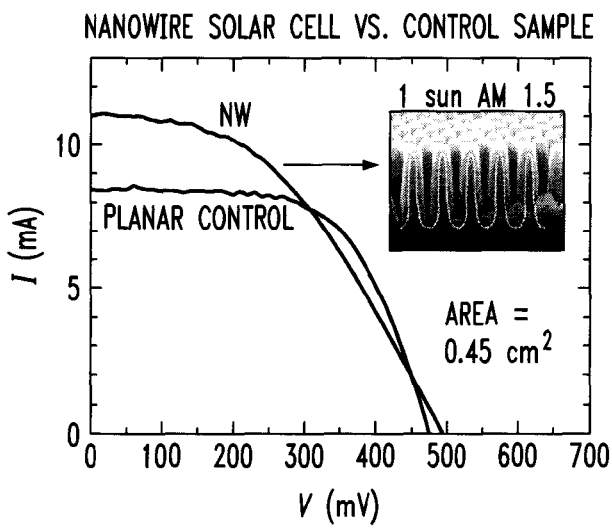
FIG. 16B
1600B
ELECTRICAL CHARACTERISTICS
|  | Voc mV | Jsc mA/cm^2 | FF | Eff % |
|---|---|---|---|---|
| NW CELL | 493.5 | 27.5 | 0.443 | 6.02 |
| CONTROL | 475.4 | 21.1 | 0.617 | 6.19 |
FIG. 16C
1600C
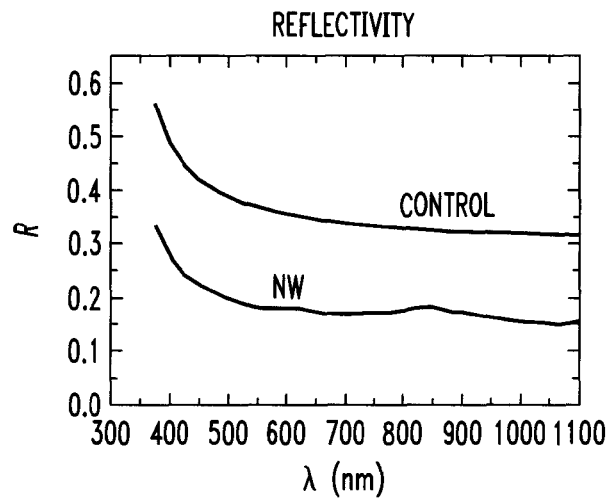

1700A

1700B

ELECTRICAL CHARACTERISTICS

|         | Voc mV | Jsc mA/cm^2 | FF    | Eff % |
|---------|--------|-------------|-------|-------|
| NW CELL | 319    | 13          | 0.338 | 1.41  |
| CONTROL | 56     | 0.44        | 0.26  | 0.01  | ns # NANO/MICROWIRE SOLAR CELL FABRICATED BY NANO/MICROSPHERE LITHOGRAPHY

CROSS-REFERENCE TO RELATED APPLICATION(S)

This application is a continuation of U.S. application Ser. No. 12/480,163 filed on Jun. 8, 2009, now U.S. Patent No. 8,211,735, the disclosure of which is incorporated by reference herein.

FIELD OF THE INVENTION

The present invention relates to solar cells, and more particularly, to techniques for fabricating nanowire/microwire-based solar cells.

BACKGROUND OF THE INVENTION

The main obstacle to the widespread utilization of solar cells is the high cost of solar cell production, with typically almost half of the production costs directed to obtaining the starting solar-grade silicon (Si) wafers (which have to meet a certain minimum thickness). Although widely used as a solar material, Si has a long absorption length due to its indirect bandgap. For example, it takes a 100 micrometer (µm)-thick Si wafer to absorb 90 percent (%) of sunlight energy above the 1.12 electron volt (eV) bandgap. See, for example, B. M. Kayes et al., "Comparison of the Device Physics Principles of Planar and Radial p-n Junction Nanorod Solar Cells," J. Appl. Phys., vol. 97, 114302 (2005) (hereinafter "Kayes").

Alternatively, lower cost materials, such as metallurgical grade poly or multi-crystalline Si, may be used. For example, in 2007 metallurgical grade Si cost about two dollars per kilogram (kg) while high quality solar-grade Si substrates cost about 20 dollars per kg. See, for example, USGS, Silicon: USGS Mineral Commodity Summaries, January 2008. These lower cost materials, however, typically have a very short minority carrier lifetime (and thus a short diffusion length) due to the presence of many impurities and grain boundaries. This unfavorable characteristic severely limits the cell efficiency.

One way to circumvent this problem is to seek efficiency enhancement in these lower cost materials. A promising approach to efficiency enhancement is to direct the carrier collection in a horizontal rather than vertical direction. This scheme can be realized in a cylindrical p-n junction configuration which allows more efficient carrier collection for short diffusion length materials as the collection occurs in a radial direction. See, for example, Kayes which describes nanorod solar cells. Unfortunately, however, conventional techniques for producing nanoscale solar devices are limited by low throughput and thus can be prohibitively expensive for large-scale commercial implementation.

Therefore, improved solar cell fabrication techniques that lower production costs and increase throughput would be desirable.

SUMMARY OF THE INVENTION

The present invention provides techniques for fabricating nanowire/microwire-based solar cells. In one aspect of the invention, a method for fabricating a solar cell is provided. The method includes the following steps. A doped substrate is provided. A monolayer of spheres is deposited onto the substrate. The spheres include nanospheres, microspheres or a combination thereof. The spheres are trimmed to introduce space between individual spheres in the monolayer. The trimmed spheres are used as a mask to pattern wires in the substrate. The wires include nanowires, microwires or a combination thereof. A doped emitter layer is formed on the patterned wires. A top contact electrode is deposited over the emitter layer. A bottom contact electrode is deposited on a side of the substrate opposite the wires.

A more complete understanding of the present invention, as well as further features and advantages of the present invention, will be obtained by reference to the following detailed description and drawings.

BRIEF DESCRIPTION OF THE DRAWINGS

FIG. 16A is a graph illustrating electrical characteristics of the solar cell of FIG. 14 according to an embodiment of the present invention;

FIG. 16B is a table illustrating electrical characteristics of the solar cell of FIG. 14 according to an embodiment of the present invention;

FIG. 16C is a graph illustrating a reflectivity spectra of the solar cell of FIG. 14 according to an embodiment of the present invention;

DETAILED DESCRIPTION OF PREFERRED EMBODIMENTS

Disclosed herein are techniques for the fabrication of nanowire and/or microwire-based solar cells. The present solar cell designs employ a cylindrical p-n junction configuration. A cylindrical p-n junction configuration allows more efficient carrier collection for short minority carrier diffusion length solar materials as the collection occurs in a radial direction. Therefore, low cost materials that might otherwise be unsuitable for use in traditional planar solar cell designs due to short minority carrier diffusion length can be implemented in the present teachings, thus realizing a production cost savings.

Further, to realize commercially viable nanowire and/or microwire-based solar cells, it is important to utilize a low-cost method to fabricate the nanowire and/or microwire structures. Accordingly, the present techniques provide a fabrication process that employs "top-down" nanosphere/microsphere lithography, thereby avoiding standard processes such as electron beam (e-beam) or ultra-violet (UV) lithography which are limited by low throughput and thus prohibitively expensive. Nanosphere/microsphere lithography fabrication techniques provide a simple, low cost and high throughput technique to define large scale nanowire and/or microwire structures. See, for example, C. L. Cheung et al., "Fabrication of Nanopillars by Nanosphere Lithography," Nanotech. 17, 1339 (2006) (hereinafter "Cheung") and Z. Huang et al., "Fabrication of Silicon Nanowire Arrays with Controlled Diameter, Length, and Density," Advanced Materials 19, 744 (2007) (hereinafter "Huang"), the contents of each of which are incorporated by reference herein. Nanosphere and/or microsphere lithography fabrication techniques rely on large scale self-assembled arrangement of nanospheres and/or microspheres (see below).

Electrical characterization of nanowire and/or microwire-based solar cells fabricated using the present techniques show promising benefits in terms of higher short circuit current and efficiency as compared to control samples (conventionally fabricated planar devices, i.e., without nanowires or microwires) (see below). Also, compared to a conventional "bottom-up" technique for large scale nanowire fabrication, i.e., a vapor liquid solid (VLS) growth process, the present nanosphere/microsphere lithography fabrication techniques are free from metal catalysts that can be very detrimental to solar cell performance. Specifically, metal catalysts involved in the VLS growth, such as gold (Au), silver (Ag) and copper (Cu), act as impurity traps to the minority carriers in the solar cell that essentially increases the recombination current. This current in turn reduces the amount of useful photo-generated current in the solar cell. In addition, nanosphere/microsphere lithography fabrication techniques offer greater flexibility in controlling the size (diameter and height) of the nanowires and/or microwires produced.

Figure 1:
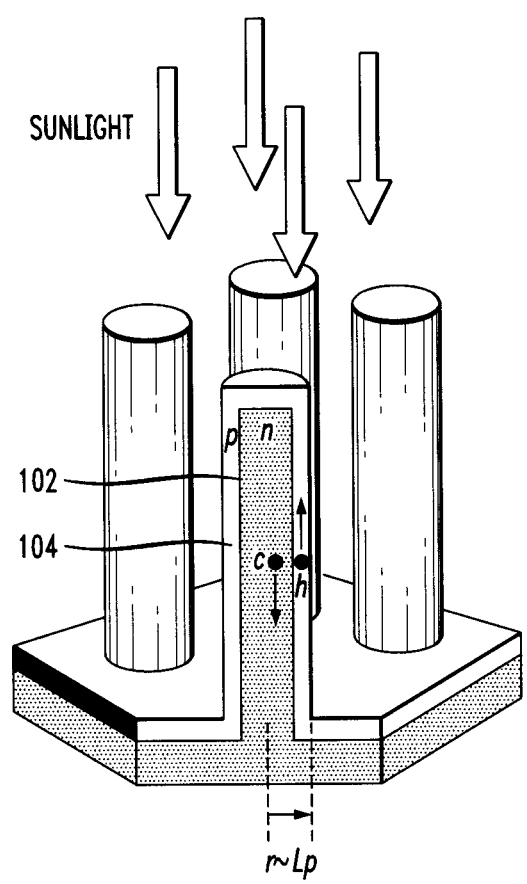
FIG. 1 is a schematic diagram illustrating an exemplary cylindrical p-n junction configuration according to an embodiment of the present invention.

FIG. 1 is a schematic diagram illustrating that in a cylindrical p-n junction configuration carrier collection is directed in a horizontal direction. As shown in FIG. 1, by way of reference to exemplary nanowire-based solar cell 100, in a cylindrical p-n junction, charge carrier (i.e., electron e-hole h pairs) collection occurs in a radial direction. Namely, the p-n junction is formed between a cylindrical core (in this example an n-type doped nanowire 102) and a layer surrounding the core (in this example a p-type doped emitter layer 104). The radius r of the nanowire is comparable to the diffusion length Lp of the minority carrier (in this case holes), i.e., $r \sim L_p$. This implies that holes could be generated anywhere in the body (i.e., nanowire 102 and underlying substrate) and they will be effectively collected and separated by the p-n junction to produce useful current. Improved carrier collection in a radial direction can improve solar cell efficiency. See, for example, Kayes, the contents of which are incorporated by reference herein. Furthermore, a nanowire film also serves as a natural anti-reflective coating that increases light absorption (see, for example, L. Tsakalakos et al., "Strong Broadband Optical Absorption in Silicon Nanowire Films," J. Nanophot. 1, 013552 (2007), the contents of which are incorporated by reference herein) especially at shorter wavelengths (see, for example, L. Hu et al., "Analysis of Optical Absorption in Silicon Nanowire Arrays for Photovoltaic Applications," Nano Lett., vol. 7, no. 11, 3249 (2007), (hereinafter "Hu"), the contents of which are incorporated by reference herein). This effect increases the energy conversion efficiency of the cells.

FIGS. 2-9 are diagrams illustrating an exemplary methodology for fabricating a nanowire and/or microwire-based solar cell. The starting platform for the fabrication process is a substrate, i.e., substrate 202 (see FIG. 2). Substrate 202 can be any semiconductor material suitable for forming a p-n junction for a solar cell. Accordingly, substrate 202 is doped with an n-type or a p-type dopant. Suitable n-type dopants include, but are not limited to phosphorous (P) and arsenic (As). Suitable p-type dopants include, but are not limited to boron (B). In one exemplary embodiment, a p-type silicon, e.g., Si(100), substrate is used.

Figure 2:
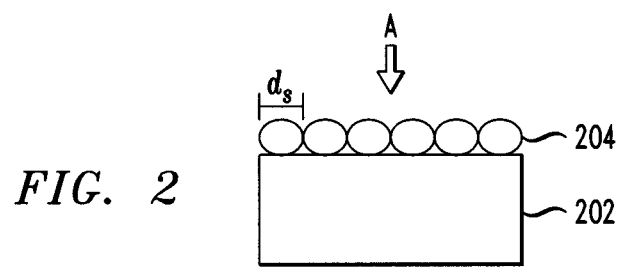
FIGS. 2-9 are diagrams illustrating an exemplary methodology for fabricating a nanowire and/or microwire-based solar cell according to an embodiment of the present invention.

As shown in FIG. 2, a monolayer of spheres 204 are deposited on the substrate. Spheres 204 include nanospheres, microspheres or a combination of nanospheres and microspheres. Nanospheres are generally considered herein to include spheres 204 having a diameter $d_s$ of less than about one µm, e.g., from about 50 nanometers (nm) to about one micrometer (µm). Microspheres are generally considered herein to include spheres 204 having a diameter $d_s$ of greater than or equal to about one µm, e.g., from about one µm to about 50 µm.

Spheres 204 will be used to pattern wires in the substrate with the diameters of the wires being dependent on the diameters of the spheres following a trimming step (see below). Thus, the post-trimming nanospheres, microspheres or a combination of nanospheres and microspheres will be used to pattern nanowires, microwires or a combination of nanowires and microwires, respectively, in the substrate. According to an exemplary embodiment, polystyrene latex spheres are used. Polystyrene latex microspheres are commercially available from Thermo Fisher Scientific, Inc., Waltham, Mass. (polystyrene latex microspheres 5000 series).

The spheres, which are usually provided in a water suspension, are diluted with methanol+Triton™-X surfactant (available from the Dow Chemical Company, Midland, Mich.) (e.g., polystyrene latex nanospheres and/or microspheres suspension:methanol:Triton™-X by 560:400:1) and deposited by a spin-on technique (for 500 nm nanospheres, for example, the spin sequences are: 400 revolutions per minute (rpm) (for 10 seconds), 800 rpm (for 120 seconds) and 1,400 rpm (for 10 seconds). The nanospheres and/or microspheres deposited in this manner will arrange themselves on the substrate in a self-assembled manner, and therefore the dilution factor is optimized to obtain a monolayer of spheres across a large area typical of a solar cell device (i.e., ranging from about one centimeter (cm)×one cm to about 50 cm×50 cm, see below). If the sphere concentration is too high, then there will (undesirably) be domains of two or more layers of nanospheres and/or microspheres on the substrate. Similarly, if the sphere concentration is too low, then there will (undesirably) be domains of open areas wherein nanospheres/microspheres are absent.

The sphere deposition process can also be performed using surface functionalization along with chemically functionalized nanospheres and/or microspheres that interact with the functionalized surface. According to an exemplary embodiment, the surface of the substrate is functionalized with amino-silane [3-(2-aminoethylamino)propyl]trimethanoxysilane (APTS). The substrate is immersed in an APTS solution for about one hour, blown dry and baked at 85 degrees Celsius (° C.) for 15 minutes. The spheres are then deposited using a simple dropcasting technique (although other deposition techniques such as spin-casting, dip-coating, spray coating and a spin-on technique as above may also be used). In this example carboxylate spheres (such as Polybead® Carboxylate Microspheres available from Polysciences, Inc., Warrington, Pa.) are used. These spheres present carboxyl (COOH) functional groups at their surface that bind with the $NH_2$ group on the functionalized surface of the substrate increasing the adhesion between the spheres and the substrate. After the solvent in the initial sphere solution evaporates, the substrate is rinsed with distilled water to remove excess spheres leaving only one monolayer of spheres on the surface. Despite the need for an additional functionalization step and special type of spheres, this method provides some advantages, such as a more robust monolayer formation, better uniformity, easier to scale up, less consumption of nanosphere solution and most notably this technique allows for use of substrate materials with a rough surface (such as multi- or poly-crystalline or amorphous semiconductor substrates). This technique could also be performed using alternate kinds of functionalization chemistries, e.g., where the substrate is functionalized with an acid group and the spheres are functionalized with a base. There are numerous other complementary chemistries one can use to bind the sphere to the surface, including numerous types of acid/base interactions or various covalent bond formation reactions. The surface functionalization can be done on a pure silicon surface, on native silicon oxide and on grown silicon oxide.

Figure 3:
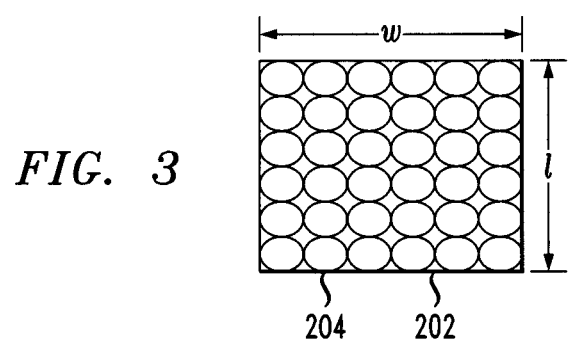

A top-down view, i.e., from vantage point A, of the monolayer of spheres 204 deposited on substrate 202 is shown in FIG. 3. FIG. 3 illustrates that the nanosphere/microsphere lithography fabrication techniques used herein rely on large scale self-assembled arrangement of the spheres. The term "large scale" means that the coverage area is much larger than the size of the nanospheres/microspheres. For example, in the present teachings, the nanospheres/microspheres are targeted to cover large area solar cell substrates, such as substrate 202, having, e.g., a length/of from about one cm to about 50 cm and a width w of from about one cm to about 50 cm. This substrate dimension is five orders of magnitude larger than a microsphere having, for example, a diameter of about one μm.

Figure 4:
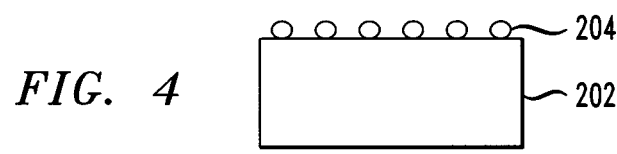

As shown in FIG. 4, spheres 204 are trimmed to introduce space between the individual spheres in the monolayer. According to an exemplary embodiment, oxygen ($O_2$) plasma reactive ion etching (RIE) is used to trim the diameters of the spheres. By how much the diameters of the spheres are trimmed/reduced is controlled by controlling the timing of the plasma etch. Empirical data relating sphere diameter and plasma etching time are presented in FIG. 12, described below. This trimming step is necessary to allow sufficient interstitial space in between the later-formed nanowires and/or microwires to accommodate for the formation of an emitter layer (see below). The trimming step also serves to reduce the nanospheres and/or microspheres to the proper size (i.e., diameter) for wire patterning. By way of example only, if the monolayer of spheres 204 (see FIG. 2, described above) contains only microspheres and patterning of nanowires in the substrate is desired, then the trimming step can be used to reduce the diameters of the spheres to the desired nanometer size. This reduction in size of the spheres as a result of the trimming step has to be taken into account when assessing the starting sphere size (pre-trimming) and the desired wire diameter.

Figure 5:
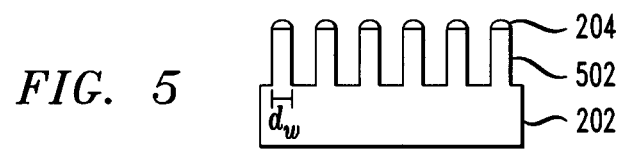
Figure 6:
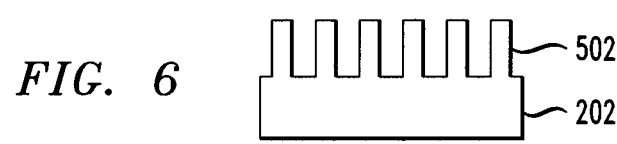
Figure 13A:
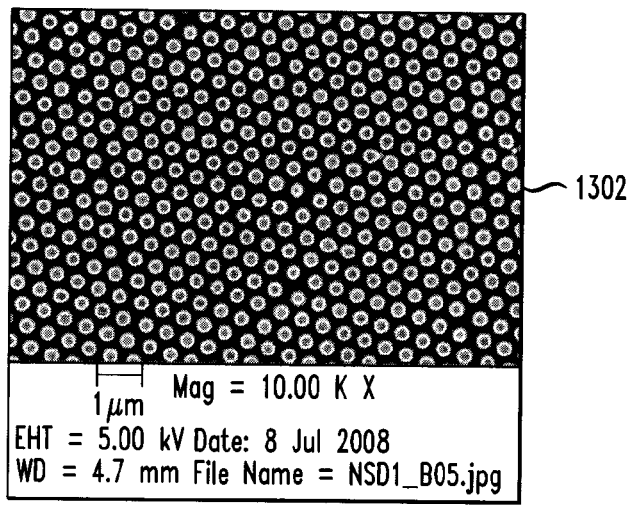
FIG. 13A is a top-down scanning electron micrograph (SEM) image of an exemplary nanowire array patterned using nanosphere masks according to an embodiment of the present invention.
Figure 13B:
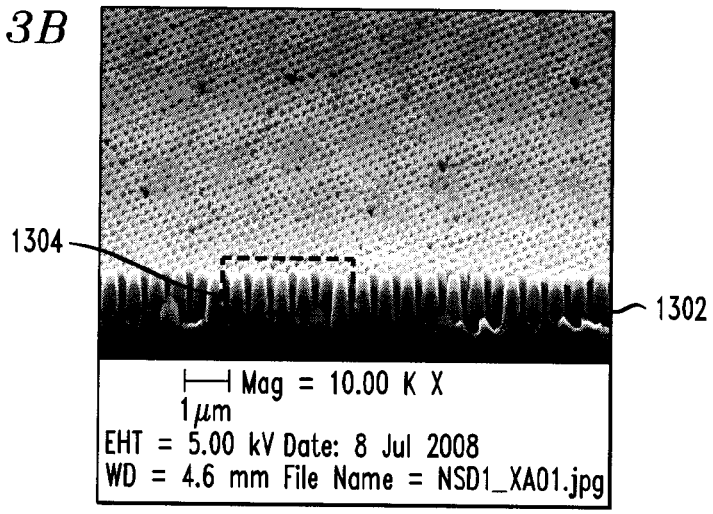
FIG. 13B is a cross-sectional SEM image of an exemplary nanowire array patterned using nanosphere masks according to an embodiment of the present invention.
Figure 13C:
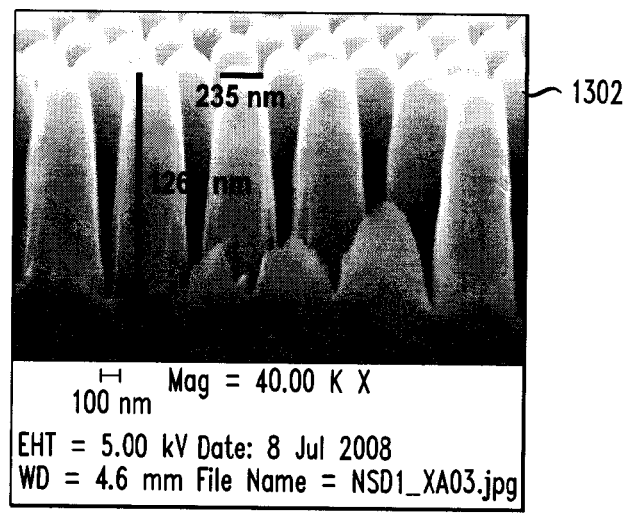
FIG. 13C is an enlarged cross-sectional SEM image of a portion of the image of FIG. 13B according to an embodiment of the present invention.

As shown in FIG. 5, spheres 204 (now with reduced diameters) are used as masks to pattern wires 502 in substrate 202. According to an exemplary embodiment, wires 502 are patterned in substrate 202 by a deep RIE process. For example, when substrate 202 comprises silicon (Si), hydrobromic acid (HBr), tetrafluoromethane ($CF_4$) and chlorine gas ($Cl_2$) chemistry or BOSCH process (e.g., a time-multiplexed RIE process consisting of etching step with sulfur hexafluoride ($SF_6$) and a passivation step with octafluorocyclobutane ($C_4F_8$)) may be used. See for example, Cheung. It is also possible to utilize a wet etching technique to avoid vacuum processing and lower the cost. See for example, Huang. While wet etching techniques make use of a metal catalyst, such as Ag, (which, as highlighted above, is not favorable for solar cell devices), the metal is only used as an etching catalyst, not as a growth catalyst, therefore it is less likely to be incorporated into the semiconductor material. So it is possible that any detrimental effects of the metal are minimal. An example of nanowires patterned in this manner (i.e., with deep RIE and nanosphere masks) is shown in FIGS. 13A-C, described below.

As highlighted above, the diameters of wires 502 patterned in substrate 202 are dependent on the post-trimming diameters of spheres 204. Thus, post-trimming, nanospheres, microspheres or a combination of nanospheres and microspheres will result in nanowires, microwires or a combination of nanowires and microwires, respectively, being patterned substrate 202. Accordingly, nanowires are generally considered herein to include wires 502 having a diameter $d_w$ of less than about one μm, e.g., from about 50 nm to about one μm. Microwires are generally considered herein to include wires 502 having a diameter $d_w$ of greater than or equal to about one μm, e.g., from about one μm to about 50 μm. Wires 502 now patterned in substrate 202 may be cleaned to remove any surface damage due to the RIE process. For Si substrates, for example, an oxidation step (such as using Piranha solution (sulfuric acid ($H_2SO_4$): hydrogen peroxide ($H_2O_2$)=3:1 by volume) for about 30 minutes) followed by an RCA clean may be used. The steps performed in an RCA clean are known to those of skill in the art and thus are not described further herein. It is also during this cleaning step that the spheres are removed. See FIG. 6.

As highlighted above, the present nanosphere/microsphere lithography fabrication techniques offer greater flexibility in controlling the size (diameter and height) of the nanowires/microwires, as compared to conventional bottom-up techniques (such as VLS nanowire growth techniques where the nanowires are grown by chemical vapor deposition process+metal catalyst). Namely, with the present top-down method one can easily control both 1) the diameter of the wires by choosing the size of the starting spheres followed by the appropriate $O_2$ plasma trimming technique, and 2) the height of the wires by controlling the etching time of the RIE process.

Figure 7:
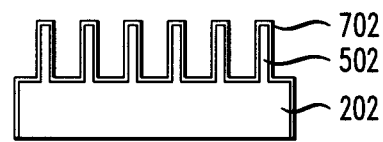

As shown in FIG. 7, an emitter layer 702 is formed on wires 502 and over substrate 202. Emitter layer 702 is highly doped with either an n-type or a p-type dopant, e.g., at a concentration of from about $1\times10^{19}$ cubic centimeters ($cm^3$) to about $1\times10^{21}$ $cm^3$, so as to have a polarity opposite to that of the substrate 202 and wires 502. Suitable n-type and p-type dopants were described above. By way of example only, if wires 502 are formed from a p-type Si substrate (see above), then emitter layer 702 would be doped with an n-type dopant to form a cylindrical p-n junction between wires 502 and emitter layer 702.

Emitter layer 702 may be formed in a couple of different ways. One way is by a drive-in diffusion technique (see FIG. 10, described below) and the other way is by deposition (see FIG. 11, described below).

Figure 8:
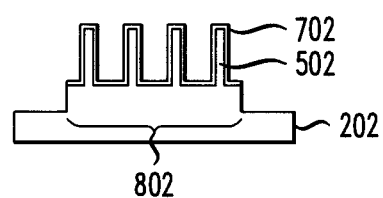

As shown in FIG. 8, a mesa structure 802 can be defined, e.g., using standard patterning techniques, to isolate the device. Suitable patterning techniques would be known to one of skill in the art and thus are not described further herein. During this step, portions of emitter layer 702 are removed from areas of substrate 202 not containing nanowires or microwires.

Figure 9:
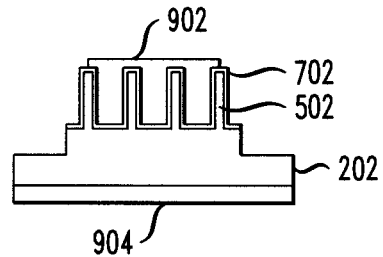

As shown in FIG. 9, a top contact electrode 902 and a bottom contact electrode 904 are formed. Specifically, top contact electrode 902 is deposited over emitter layer 702 and bottom contact electrode 904 is deposited on a side of substrate 202 opposite wires 502. According to an exemplary embodiment, top contact electrode 902 includes indium-tin-oxide (ITO) and/or one or more of aluminum (Al), Cu, nickel (Ni), titanium (Ti), palladium (Pd), Ag and Au (such as Ti/Pd/Ag or Ti/Au), and bottom contact electrode 904 includes one or more of Al, Cu, Ni, Ti, Pd, Ag and Au (such as Ti/Pd/Ag or Ti/Au). Top contact electrode 902 and/or bottom contact electrode 904 may be deposited using metal evaporation, electroplating or screen printing. As will be described below, top contact electrode 902 can be formed as a conformal layer over the emitter layer.

Figure 10:
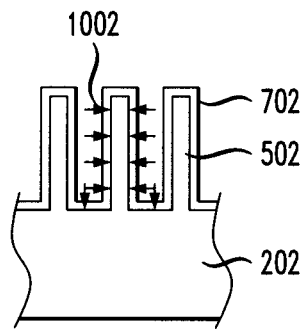
FIG. 10 is a diagram illustrating the formation of an emitter layer by diffusion according to an embodiment of the present invention.

As highlighted, for example, in conjunction with the description of FIG. 7, above, emitter layer 702 may be formed in a couple of different ways. FIG. 10 illustrates the formation of emitter layer 702 by diffusion. Namely, emitter layer 702 is formed by diffusing an n-type or p-type dopant onto wires 502 from a dopant source (as indicated by arrows 1002). Suitable dopant sources include, but are not limited to, a spin-on-glass (SOG) dopant or a gas phase dopant precursor, such as phosphoryl chloride ($POCl_3$).

For example, using a spin-on-glass (SOG) dopant source, the SOG is first deposited on wires 502 and the sample is then annealed for a drive-in diffusion step at a temperature of from about 850° C. to about 1,000° C., for a duration of from about 10 minutes to about 30 minutes (the duration depending on the targeted junction depth). For a gas phase dopant precursor, such as $POCl_3$, wires 502 are first exposed to the gas phase dopant precursor and the sample is then annealed at a temperature of about 800° C. for a duration of about one hour (the duration can be adjusted accordingly to tune the junction depth).

Figure 11:
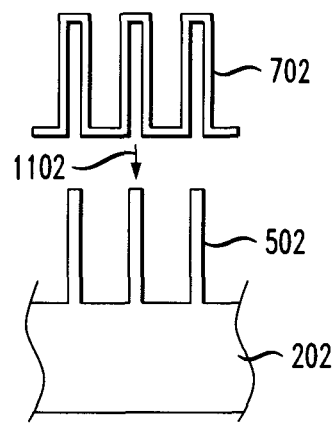
FIG. 11 is a diagram illustrating the formation of an emitter layer by deposition according to an embodiment of the present invention.

FIG. 11 illustrates the formation of emitter layer 702 by deposition. Namely, emitter layer 702 is formed by depositing a semiconductor material with a doping type that is opposite to the substrate on wires 502 to form emitter layer 702 (as indicated by arrow 1102). For example, if the substrate is a p-type substrate one could deposit n-type Si or another n-type material(s), such as zinc oxide (ZnO) and/or ITO, on wires 502. According to an exemplary embodiment, the semiconductor material(s) is deposited on wires 502 using evaporation, sputtering or epitaxial growth. Evaporation, sputtering and epitaxial growth deposition techniques are known to those of skill in the art and thus are not described further herein. A solar cell with the emitter layer formed in this manner (i.e., by deposition) guarantees conformal formation of a p-n junction on the nanowire/microwire surface which is needed to obtain improved carrier collections in a radial direction (see, for example, Kayes). Specifically, with the (emitter layer) deposition process, the resulting p-n junction interface wraps around the nanowire/microwire surface, thus providing a radial p-n junction structure. Conformal formation of a p-n junction on the nanowire/microwire surface can also be obtained with the (emitter layer) diffusion process. However, tight and uniform control of the diffusion process is needed. For example, control over the duration of the drive-in diffusion step is needed to prevent over/under diffusion which can negatively affect the p-n junction structure.

In addition, using the deposition process to form the emitter layer allows the emitter layer to be formed from a different material than the substrate and the nanowires/microwires. Employing an emitter layer with a different material than the substrate and the nanowires/microwires allows for the formation of heterojunction nanowire/microwire solar cells. Heterojunction nanowire/microwire solar cells have advantages over standard homojunction solar cell. For example, with heterojunction nanowire/microwire solar cells one could use a higher bandgap material that will serve as a window emitter layer. This layer would be transparent to light, thus allowing most of the photons to pass therethrough towards the more effective absorber (substrate) layer, while at the same time this window layer can serve as a surface passivation layer that will reduce surface recombination.

Figure 12:
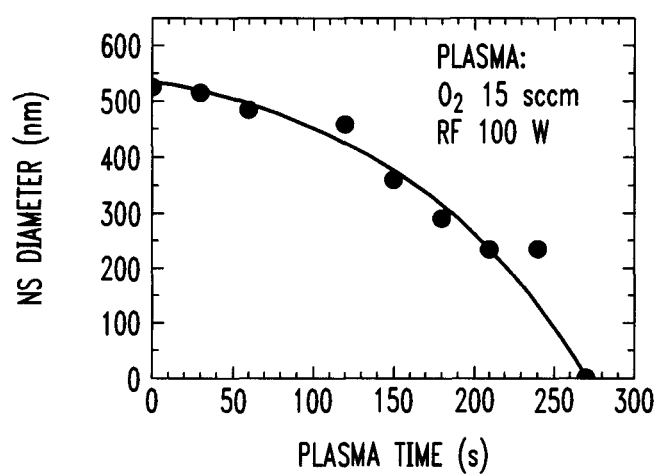
FIG. 12 is a graph relating nanosphere diameter and plasma etching time according to an embodiment of the present invention.

As was described, for example, in conjunction with the description of FIG. 4, above, an oxygen plasma RIE process can be used to trim the nanospheres/microspheres. The amount by which the diameters of the nanospheres/microspheres are trimmed/reduced can be controlled by controlling the timing of the plasma. To illustrate this process, empirical data relating to an instance where a plasma etch was used to trim nanospheres is provided in FIG. 12. Namely, FIG. 12 is a graph 1200 relating nanosphere diameter and plasma etching time. In graph 1200, plasma time (duration) (measured in seconds (s)) is plotted on the x-axis and nanosphere (NS) diameter (measured in nm) is plotted on the y-axis. The plasma etch used in this example was performed with an oxygen ($O_2$) flow of 15 standard cubic centimeters per minute (sccm) and a radio frequency (RF) power source of 100 watts (W).

FIG. 13A is top-down scanning electron micrograph (SEM) image 1300A and FIG. 13B is a cross-sectional SEM image 1300B of an exemplary nanowire array patterned using nanosphere masks. The process for patterning nanowires and/or microwires using nanospheres and/or microsphere masks was described in detail above. In this example, the array of nanowires 1302 was patterned in a p-type Si(100) substrate. The nanospheres, present in a water suspension, were diluted in methanol at a ratio of 4:7 (methanol:nanospheres). After deposition, the nanospheres were trimmed, as described above, using an oxygen ($O_2$) plasma RIE with an $O_2$ flow of 15 sccm and a RF power source of 100 W at a pressure of 1.76 Torr with time adjusted accordingly to obtain final nanosphere diameters as shown in FIG. 12 (described above). The process continues with a deep RIE using HBr as the main etchant agent with a pressure of four millitorr (mTorr), RF power of 650 W and gas flow of 160 sccm for a duration of about four minutes. An enlarged view of portion 1304 (of image 1300B) is shown in FIG. 13C.

FIG. 13C is an enlarged image 1300C of portion 1304 of image 1300B (FIG. 13B). Image 1300C illustrates that each of nanowires 1302 in the patterned array has a height of about 1,260 nm and a top diameter of about 235 nm.

Figure 14:
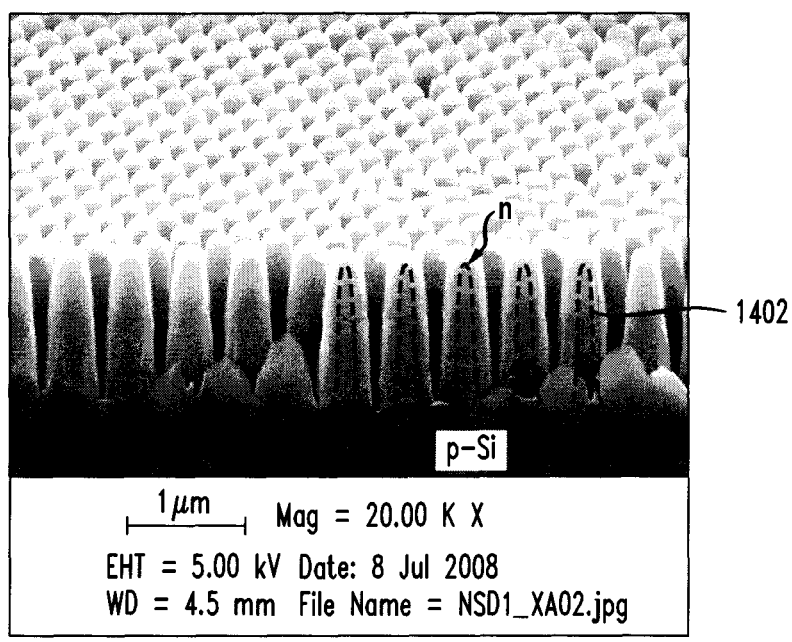
FIG. 14 is a cross-sectional SEM image of a solar cell having an emitter layer formed on a nanowire array by diffusing a phosphorous spin-on dopant source according to an embodiment of the present invention.

FIG. 14 is a cross-sectional SEM image 1400 of a solar cell having an emitter layer 1402 formed on a nanowire array by diffusing (i.e., driving in) a phosphorous spin-on dopant source (P509). The formation of an emitter layer by diffusion was described, for example, in conjunction with the description of FIG. 10, above. In this example, the nanowire array was patterned in a p-type Si(100) (p-Si) substrate, using the techniques described above. The phosphorous dopant was deposited on the nanowires using a spin-on technique and then diffused into the nanowires by a heat treatment at about 850° C. for a duration of about 30 minutes.

Figure 15:
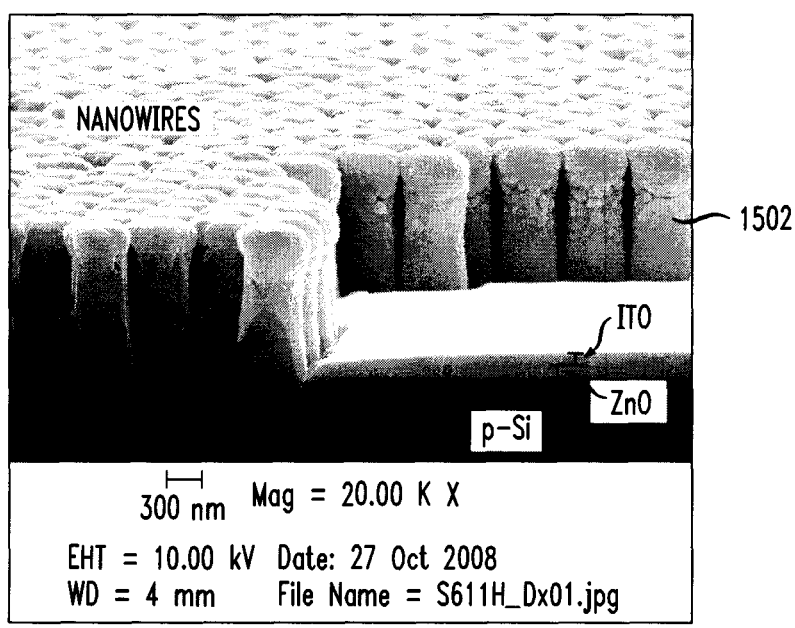
FIG. 15 is a cross-sectional SEM image of a solar cell having an n-type emitter layer formed by sputtering a zinc oxide (ZnO) layer on a nanowire array according to an embodiment of the present invention.

FIG. 15 is a cross-sectional SEM image 1500 of a solar cell having an n-type emitter layer 1502 formed by sputtering a ZnO layer on a nanowire array. The formation of an emitter layer by deposition was described, for example, in conjunction with the description of FIG. 11, above. In this example, the nanowire array was patterned in a p-type Si(100) (p-Si) substrate, using the techniques described above. The ZnO emitter layer was sputtered on the nanowires to a thickness of about 900 angstroms (Å). A conformal layer of ITO was then deposited over the ZnO emitter layer and surrounding each nanowire to a thickness of about 1,500 Å and serves as a top contact electrode.

Electrical characterization tests were performed for the solar cells of FIG. 14 (i.e., having an emitter layer formed on a nanowire array by diffusing a phosphorous spin-on dopant source) and FIG. 15 (i.e., having an n-type emitter layer formed by sputtering a ZnO layer on a nanowire array) under simulated solar (one sun AM1.5 spectrum) illumination. In each test, a planar control cell, i.e., a solar cell without nanowires, was also tested for comparison. The results of the tests performed on the solar cell of FIG. 14 are shown in FIGS. 16A-C, and the results of the tests performed on the solar cell of FIG. 15 are shown in FIGS. 17A and B.

FIG. 16A is a graph 1600A illustrating electrical characteristics of the nanowire-based solar cell of FIG. 14 (i.e., NW) having an emitter layer formed by diffusion and a standard planar solar cell (i.e., planar control). A top contact electrode that includes, for example, one or more of Al, Cu, Ni, Ti, Pd, Ag and Au (such as Ti/Pd/Ag or Ti/Au) is formed over the emitter layer of the nanowire-based solar cell (see the description of FIG. 9, above). Graph 1600A shows the electrical characteristics under simulated one sun illumination. In graph 1600A, voltage V (measured in millivolts (mV)) is plotted on the x-axis and current I (measured in milliamps (mA)) is plotted on the y-axis. The solar cell area is 0.45 square centimeters ($cm^2$). FIG. 16B is a table 1600B illustrating electrical characteristics of the nanowire-based solar cell of FIG. 14 (i.e., NW cell) having an emitter layer formed by diffusion and the standard planar solar cell (i.e., Control). The electrical characteristics shown in table 1400B (derived from graph 1600A) are open circuit current ($V_{OC}$) (measured in mV), short circuit current ($J_{sc}$) (measured in milliamps per square centimeter ($mA/cm^2$)), fill factor (FF) and percent (%) efficiency (Eff). FIG. 16C is a graph 1600C illustrating a reflectivity spectra of the nanowire-based solar cell of FIG. 14 (i.e., NW) having an emitter layer formed by diffusion and the standard planar solar cell (i.e., Control). In graph 1600C, wavelength (λ) (measured in nm) is plotted on the x-axis and reflectivity (R) is plotted on the y-axis. From the results shown in FIGS. 16A-C it is apparent that the solar cell of FIG. 14 had higher short circuit current ($J_{SC}$) than the planar control cell. This benefit could be attributed to better light trapping or anti-reflective properties due to the presence of the nanowires. However the nanowire-based solar cell has worse fill factor (FF), thus the overall efficiency does not improve but is close to that of the control sample. The poor fill factor (FF) is associated with significant series resistance. Reducing this series resistance by using a conformal and conducting layer such as ITO on top (as described above) will improve the nanowire-based solar cell efficiency. The nanowire-based solar cell exhibited smaller reflectance, demonstrating a better light trapping property consistent with the higher short circuit current.

Figures 17A, 17B:
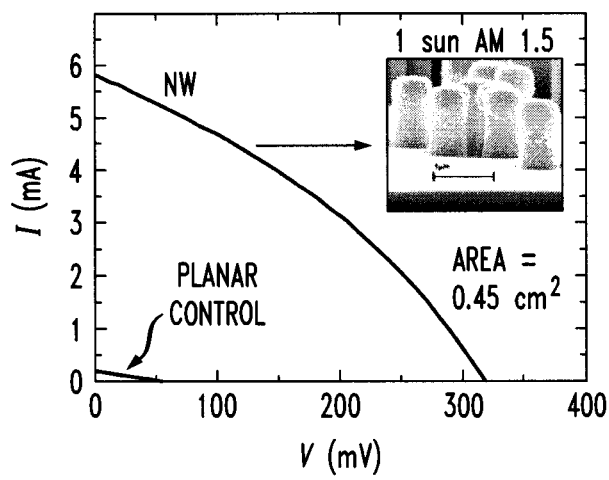
FIG. 17A is a graph illustrating electrical characteristics of the solar cell of FIG. 15 according to an embodiment of the present invention.
FIG. 17B is a table illustrating electrical characteristics of the solar cell of FIG. 15 according to an embodiment of the present invention.

FIG. 17A is a graph 1700A illustrating electrical characteristics of the nanowire-based solar cell of FIG. 15 (i.e., NW) having an emitter layer formed by deposition and a standard planar solar cell (i.e., planar control). A top contact electrode that includes, for example, one or more of Al, Cu, Ni, Ti, Pd, Ag and Au (such as Ti/Pd/Ag or Ti/Au) is formed over the emitter layer of the nanowire-based solar cell (see the description of FIG. 9, above). Graph 1700A shows the electrical characteristics under simulated one sun illumination. In graph 1700A, voltage V (measured in mV) is plotted on the x-axis and current I (measured in mA) is plotted on the y-axis. The solar cell area is 0.45 $cm^2$. FIG. 17B is a table 1700B illustrating electrical characteristics of the nanowire-based solar cell of FIG. 15 (i.e., NW cell) having an emitter layer formed by deposition and the standard planar solar cell (i.e., Control). The electrical characteristics shown in table 1700B (derived from graph 1700A) are open circuit current ($V_{OC}$) (measured in mV), short circuit current ($J_{SC}$) (measured in $mA/cm^2$), fill factor (FF) and percent (%) efficiency (Eff). From the results shown in FIGS. 17A and 17B it is apparent that the solar cell of FIG. 15 had higher performance in all respects (i.e., $V_{OC}$, $J_{SC}$, efficiency) compared to the control sample.

In conclusion, in both examples of nanowire-based solar cells that were fabricated, i.e., one with an emitter layer formed by diffusion (FIG. 14) and one with an emitter layer formed by deposition (FIG. 15) there are promising benefits that can be derived from nanowire-based solar cells in terms of higher short circuit current and efficiency. Thus, it has been demonstrated that nanosphere/microsphere lithography is a viable technique to realize nanowires/microwires in large scale with low cost and high throughput necessary for solar cell production.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a solar cell, comprising the steps of:
   providing a doped substrate;
   depositing a monolayer of spheres onto the substrate, the spheres comprising nanospheres, microspheres or a combination thereof;
   trimming the spheres to introduce space between individual spheres in the monolayer;
   using the trimmed spheres as a mask to pattern wires in the substrate, the wires comprising nanowires, microwires or a combination thereof;
   forming a doped emitter layer on the patterned wires, wherein the emitter layer is formed from a different, higher bandgap, material than the substrate and the wires such that a heterojunction is formed therebetween, and wherein the emitter layer, which is transparent to light and serves as a window emitter layer, is formed as a conformal layer covering all exposed surfaces of the wires and a top surface of the substrate;
   wherein the top contact electrode comprises a conformal layer deposited over the emitter layer and surrounding each of the wires; and
   depositing a bottom contact electrode on a side of the substrate opposite the wires.

2. The method of claim 1, wherein the substrate is a silicon substrate.

3. The method of claim 1, wherein the spheres comprise polystyrene latex nanospheres, microspheres or a combination thereof.

4. The method of claim 1, wherein the spheres are in a liquid suspension, the method further comprising the step of:
depositing the spheres onto the substrate using a spin-on technique.

5. The method of claim 1, wherein the spheres are trimmed using oxygen plasma etching.

6. The method of claim 1, wherein the wires are patterned in the substrate using a deep reactive ion etching process.

7. The method of claim 6, further comprising the step of:
cleaning the wires to remove surface damage due to the deep reactive ion etching process.

8. The method of claim 1, wherein the substrate is doped with either an n-type or a p-type dopant.

9. The method of claim 8, wherein the emitter layer is doped with either an n-type dopant, if the substrate is doped with a p-type dopant, or a p-type dopant, if the substrate is doped with an n-type dopant.

10. The method of claim 9, wherein the emitter layer is doped with the n-type or p-type dopant to a concentration of from about $1 \times 10^{19}$ cm$^3$ to about $1 \times 10^{21}$ cm$^3$.

11. The method of claim 1, wherein the emitter layer comprises ZnO, and wherein the top contact electrode comprises a conformal layer of ITO.

12. The method of claim 1, further comprising the step of:
functionalizing a surface of the substrate onto which the monolayer of spheres is deposited with an acid group and a surface of the spheres with a base to increase adhesion of the spheres and the substrate.

13. The method of claim 1, further comprising the step of:
after the emitter layer has been formed on the patterned wires, patterning a mesa structure to isolate the solar cell which thereby serves to remove portions of the emitter layer from areas of the substrate not containing the wires.

14. The method of claim 1, wherein the step of forming the emitter layer on the wires further comprises the step of:
depositing an n-type or a p-type semiconductor material on the wires.

15. The method of claim 14, wherein the n-type or p-type semiconductor material is deposited on the wires using evaporation, sputtering or epitaxial growth.

16. The method of claim 1, wherein the top contact electrode comprises indium-tin-oxide and one or more of aluminum, copper, nickel, titanium, palladium, silver and gold.

17. The method of claim 1, wherein the bottom contact electrode comprise one or more of aluminum, copper, nickel, titanium, palladium, silver and gold.

18. The method of claim 1, wherein the top contact electrode and the bottom contact electrode are deposited using metal evaporation, electroplating or screen printing.

19. The method of claim 1, wherein the spheres comprise at least one functional group on a surface thereof, the method further comprising the step of:
functionalizing a surface of the substrate onto which the monolayer of spheres is deposited with a group complementary to the functional group on the surface of the spheres to increase adhesion of the spheres and the substrate.

20. The method of claim 19, wherein the spheres comprise carboxyl functional groups on the surface thereof and the surface of the substrate is functionalized with amino-silane [3-(2-aminoethylamino)propyl]trimethanoxysilane.

21. A method for fabricating a solar cell, comprising the steps of:
depositing a monolayer of spheres onto a doped substrate;
trimming the spheres to introduce space between individual spheres in the monolayer;
patterning wires in the substrate using the trimmed spheres as a mask;
forming a doped emitter layer on the patterned wires and on the substrate, such that the doped emitter layer is in contact with the patterned wires and the substrate, wherein the emitter layer is formed from a different, higher bandgap, material than the substrate and the wires such that a heterojunction is formed therebetween, and wherein the emitter layer, which is transparent to light and serves as a window emitter layer, is formed as a conformal layer covering all exposed surfaces of the patterned wires and a top surface of the substrate;
wherein the top contact electrode comprises a conformal layer deposited over the emitter layer and surrounding each of the wires; and
depositing a bottom contact electrode on a side of the substrate which is opposite the wires.

22. The method of claim 21, wherein the spheres comprise nanospheres, microspheres or a combination thereof.

23. The method of claim 21, wherein the wires comprise nanowires, microwires or a combination thereof.

* * * * *